(12) United States Patent
Yang

(10) Patent No.: US 7,297,610 B2
(45) Date of Patent: Nov. 20, 2007

(54) METHOD OF SEGMENTING A WAFER

(75) Inventor: Chen-Hsiung Yang, Taipei Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 354 days.

(21) Appl. No.: 11/160,975

(22) Filed: Jul. 18, 2005

(65) Prior Publication Data

US 2006/0276005 A1 Dec. 7, 2006

(30) Foreign Application Priority Data

Jun. 1, 2005 (TW) .............................. 94117995 A

(51) Int. Cl.
*H01L 21/30* (2006.01)

(52) U.S. Cl. ...................... 438/455; 438/458; 438/464; 257/23.106

(58) Field of Classification Search ................ 438/455, 438/458, 464
See application file for complete search history.

(56) References Cited

U.S. PATENT DOCUMENTS

| 7,041,577 B2* | 5/2006 | Rayssac et al. ............. 438/458 |
| 7,118,990 B1* | 10/2006 | Xu et al. .................... 438/455 |
| 2002/0123210 A1* | 9/2002 | Liu ............................ 438/459 |
| 2006/0030130 A1* | 2/2006 | Shao et al. ................. 438/464 |

* cited by examiner

*Primary Examiner*—Thanh Nguyen
(74) *Attorney, Agent, or Firm*—Winston Hsu

(57) ABSTRACT

First, a device wafer having a substrate layer and a device layer is provided. Then, a first mask pattern is utilized to remove the device layer uncovered by the first mask pattern. Subsequently, a medium layer is formed on the surface of the device wafer, and the medium layer is then bonded to a carrier wafer. Thereafter, a second mask pattern is utilized to remove the substrate layer uncovered by the second mask pattern. Finally, the medium layer is separated from the carrier wafer, the substrate layer is bonded to an extendable film, and the medium layer is then removed.

17 Claims, 13 Drawing Sheets

METHOD OF SEGMENTING A WAFER

BACKGROUND OF THE INVENTION

1. Field of the Invention

The present invention substantially relates to a method of segmenting a wafer, and more particularly, to a method that allows automatic wafer expansion and wafer sorting after dicing the wafer.

2. Description of the Prior Art

In the fabrication of semiconductor chips or MEMS chips, a wafer is first treated with tens or more than hundreds of processes to form a plurality of semiconductor devices or MEMS devices. The wafer is subsequently diced by a dicing process to form a plurality of dies. The dies are thereafter packaged so as to form a plurality of chips able to be electrically connected to printed circuit boards.

Please refer to FIG. 1, which is a schematic diagram illustrating a conventional method of performing a dicing process with a dicing apparatus. As shown in FIG. 1, a wafer 10 to undergo a dicing process is bonded to a bonding layer 12, such as a tape. The bonding layer 12 meanwhile is bonded to a supporting frame 14 so as to fasten the position of the wafer 10. When the wafer 10 is accurately aligned in the dicing apparatus, a cutter 16 is exploited through predetermined scribe lines to segment the wafer 10 into a plurality of dies 18. Selectively, a wafer expansion process can be performed according to the dimension of the scribe lines by expanding the bonding layer 12, so as to enlarge the gap between two adjacent dies 18 for the convenience of a further wafer sorting process.

The above method is the most common way to dice the wafer 10. However, since the width of the cutter 16 is no longer ignorable as the critical dimension of semiconductor processes decreases and the improvement of wafer integration, the dicing process using the cutter 16 is no longer able to dice a wafer with high integration. Therefore, a dicing process by way of etching is another choice.

Please refer to FIG. 2, which is a conventional method of performing a dicing process in an etching manner. As shown in FIG. 2, a wafer 30, having a photoresist pattern 36 disposed thereon for defining scribe lines, is bonded to a carrier 34 with a bonding layer 32. Then, an anisotropic etching process is performed to etch the wafer 30 uncovered by the photoresist pattern 36 until the wafer 30 is etched through so as to form a plurality of dies 38.

The above method is able to reduce the dimension of the scribe lines so as to increase the amounts of dies 30 arranged in the wafer. However, due to the narrowness of the scribe lines, the wafer sorting process cannot be easily performed after the dicing process. In addition, since the carrier 34, such as a bare wafer, is a rigid structure, the wafer expansion process in which the bonding layer 32 is extended to increase the gap of the dies 38 cannot be carried out. In such a case, the photoresist pattern 36 is removed in advance, and then the bonding layer 32 is removed to separate the dies 38 from the carrier 34. Following that, the dies 38 are picked up and sorted manually. Accordingly, the throughput is reduced and the dies 38 may be damaged.

SUMMARY OF THE INVENTION

It is therefore a primary object of the claimed invention to provide a method of segmenting a wafer to overcome the aforementioned problems.

According to the claimed invention, a method of segmenting a wafer is provided. The method of the present invention includes at least the following steps:

providing a device wafer including a substrate layer and a device layer disposed from bottom to top;

forming a first mask pattern on a surface of the device layer, the first mask pattern including a plurality of first openings which partially expose the surface of the device layer;

removing the device layer not covered by the first mask pattern;

removing the first mask pattern, and forming a medium layer on the surface of the device layer;

bonding a surface of the medium layer to a carrier wafer;

forming a second mask pattern on a surface of the substrate layer, the second mask pattern including a plurality of second openings corresponding to the first openings;

removing the substrate layer not covered by the second mask pattern;

removing the second mask pattern;

separating the medium layer from the carrier wafer; and bonding the substrate layer to an extendable film, and removing the medium layer.

According to the method of the present invention, the device wafer is bonded to the carrier wafer with the medium layer. Subsequently, an anisotropic etching process is performed from the substrate layer, and the device wafer is then bonded to an extendible film for the facility of successive automatic wafer expansion and wafer sorting process. Since the medium layer is removed by a dry clean process, the device layer is not contaminated and the extendable film is not damaged.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
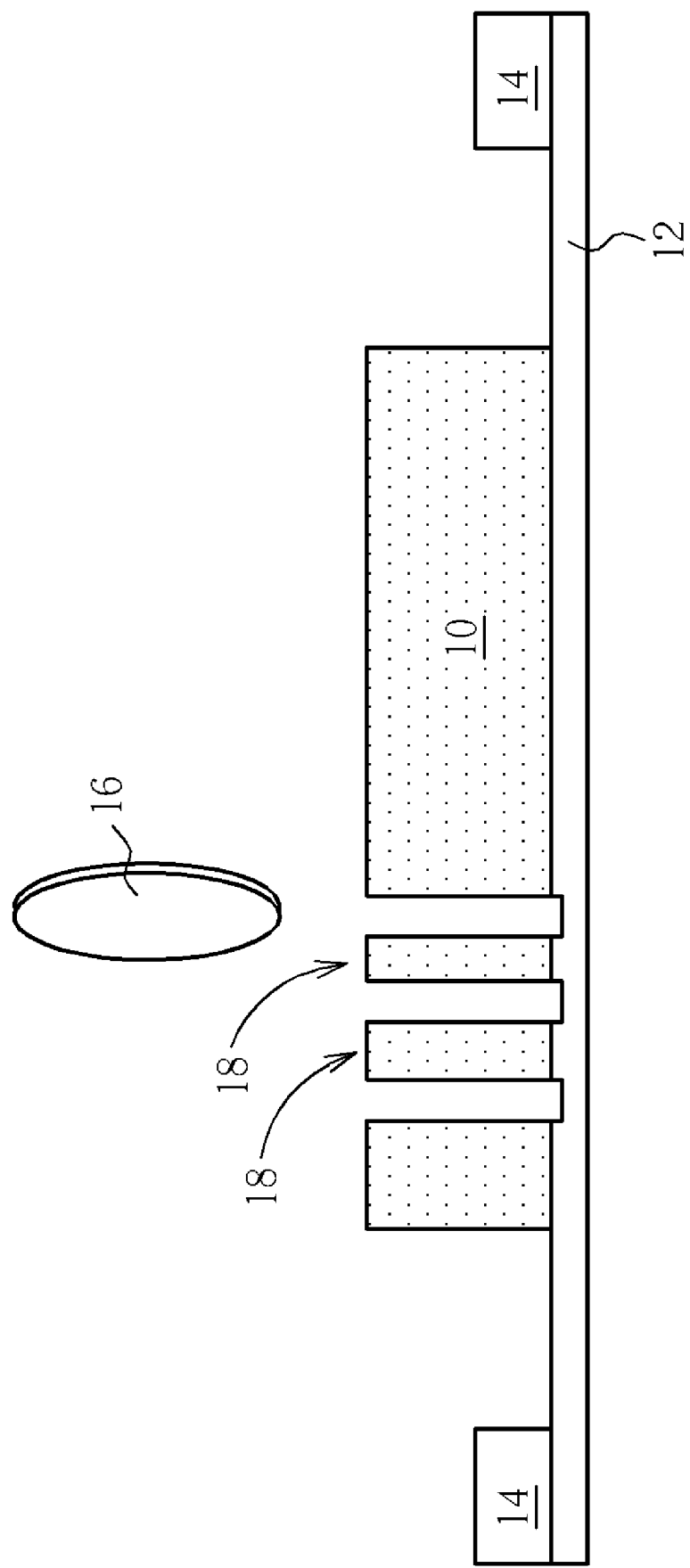
FIG. 1 is a schematic diagram illustrating a conventional method of performing a dicing process with a dicing apparatus.
Figure 2:
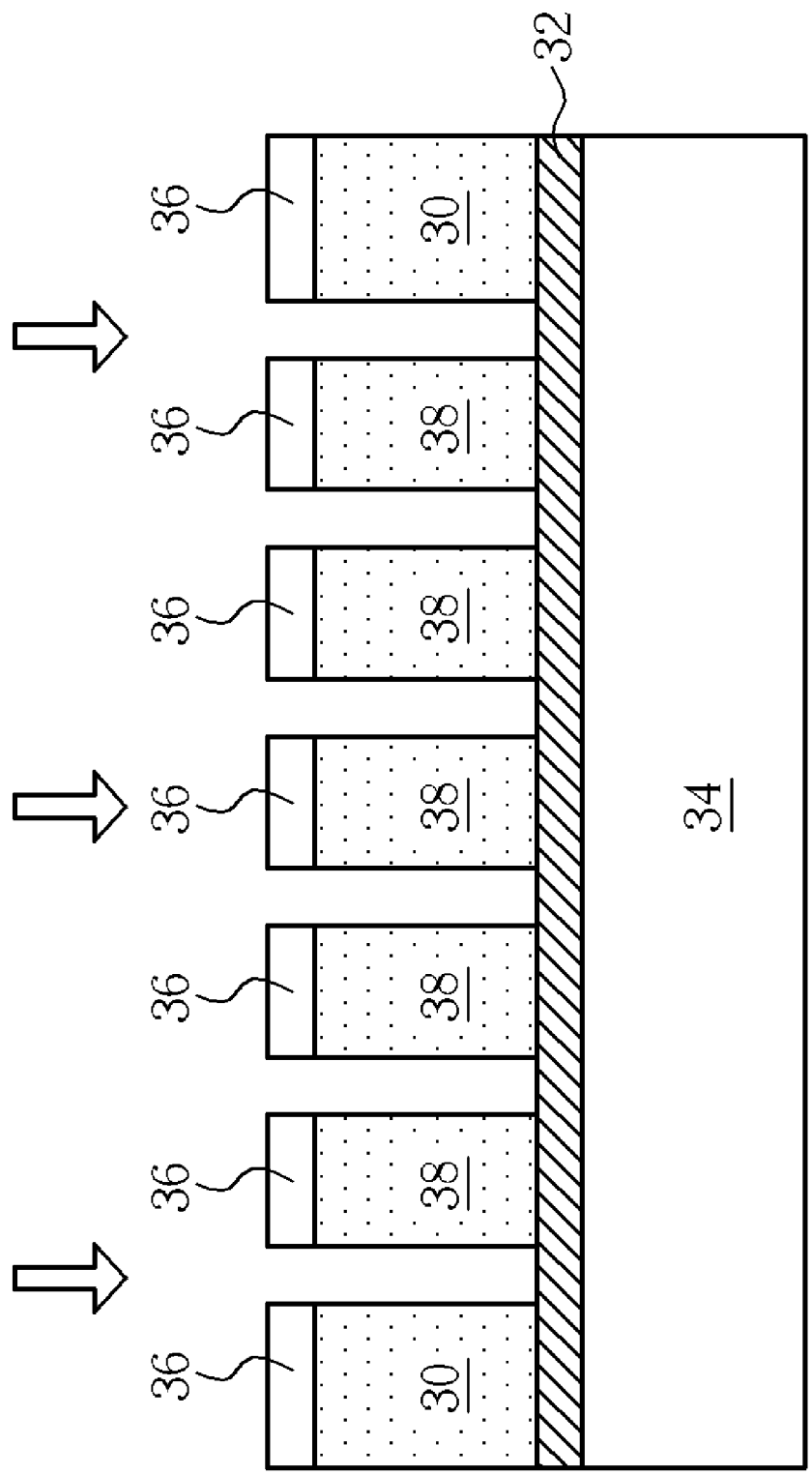
FIG. 2 shows a conventional method of performing a dicing process by etching.
Figure 3:
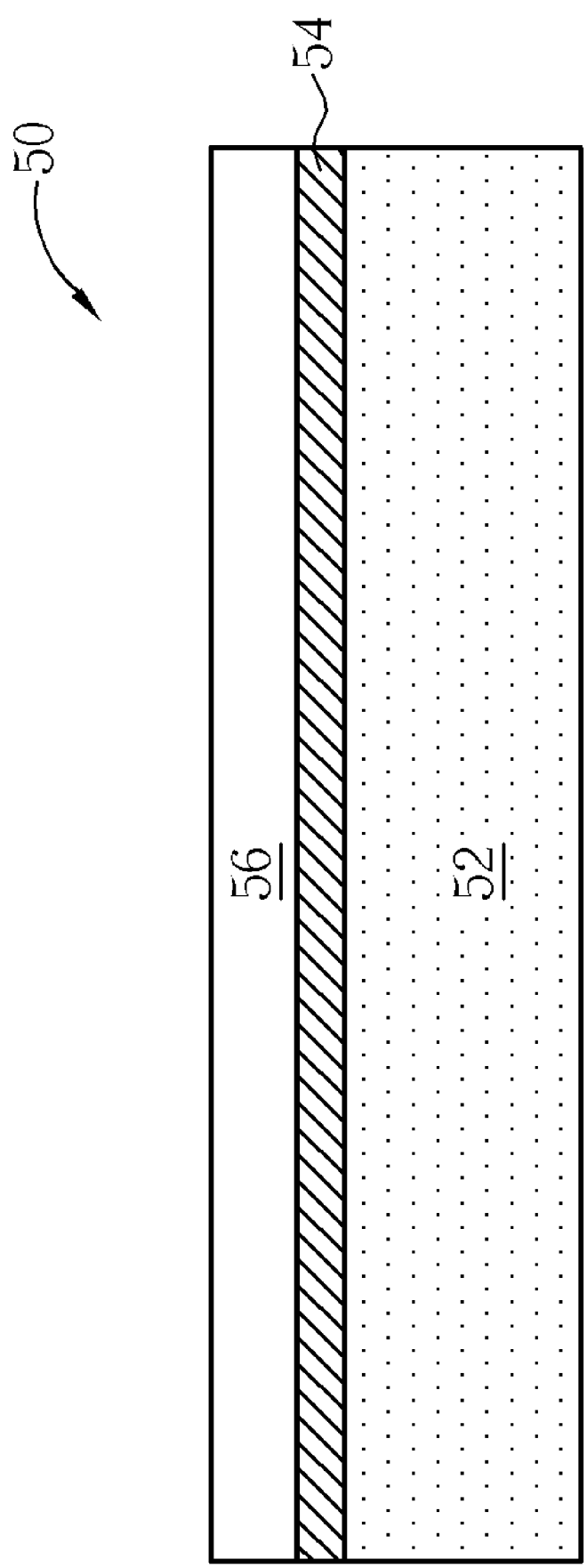
FIG. 3 through FIG. 13 are schematic diagrams illustrating a method of segmenting a wafer according to a preferred embodiment of the present invention.

Please refer to FIG. 3 through FIG. 13. FIG. 3 through FIG. 13 are schematic diagrams illustrating a method of segmenting a wafer according to a preferred embodiment of the present invention. As shown in FIG. 3, a device wafer 50 including a substrate layer 52, an insulating layer 54, and a device layer 56 disposed from bottom to top is provided. The device layer 56 includes a plurality of devices (not shown) to be diced. In this embodiment, the device wafer 50 is an SOI wafer, but not limited to. The device wafer 50 can also be a silicon wafer or other semiconductor wafer.

Figure 4:
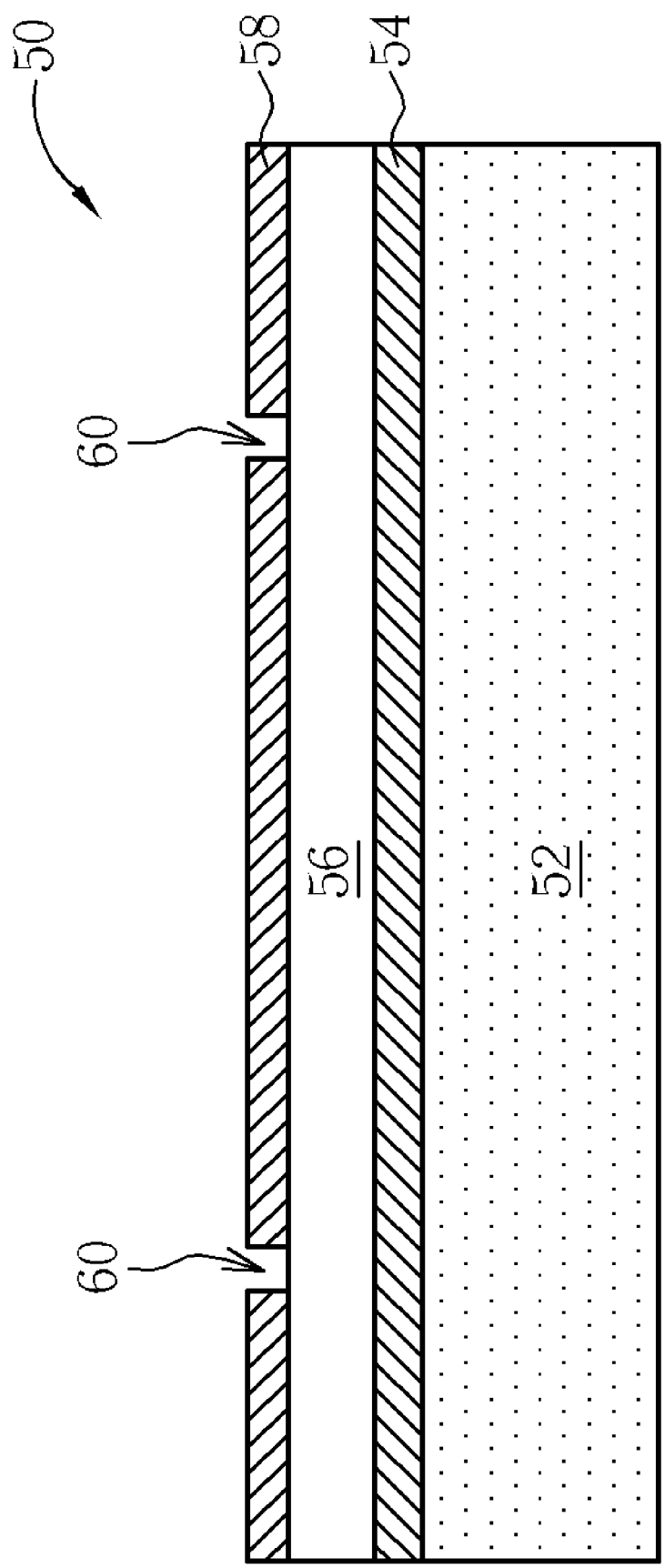

As shown in FIG. 4, a first mask pattern 58 is formed on the surface of the device layer 56. The first mask pattern 58 includes a plurality of first openings 60 that partially expose the surface of the device layer 56. The first mask pattern 58 can be a photoresist pattern or other materials normally adopted as a hard mask. The first openings 60 expose predetermined scribe lines of the device wafer 50.

Figure 5:
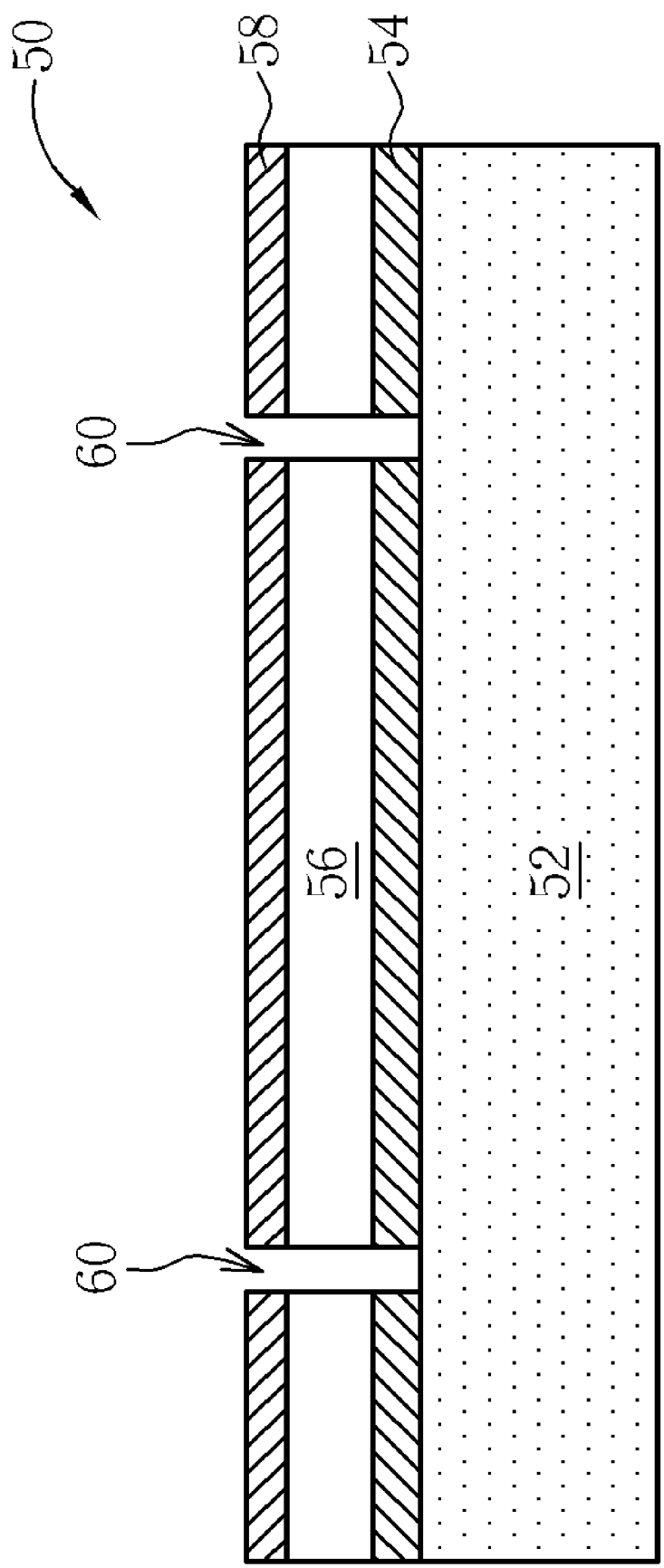
Figure 6:
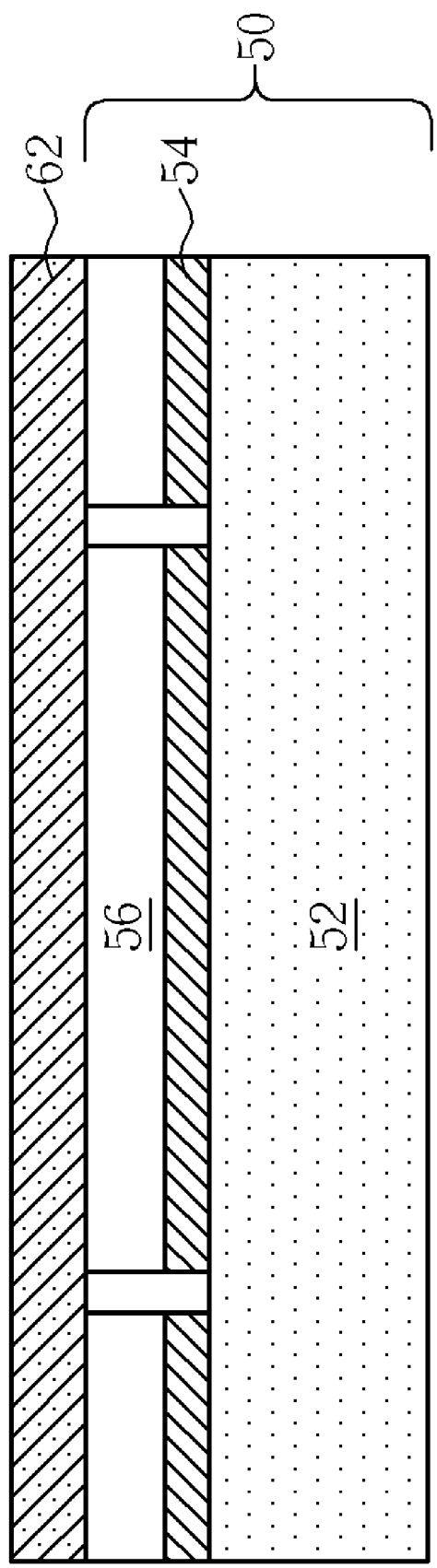

As shown in FIG. 5, an anisotropic etching process, e.g. a plasma etching process, is performed to remove the device layer 56 and the insulating layer 54 not protected by the first mask pattern 58. As shown in FIG. 6, the first mask pattern 58 is then removed, and a medium layer 62 is formed on the surface of the device layer 56. The medium layer 62 serves as a medium for fastening the device wafer 50 on a carrier wafer (not shown), and also functions to protect the device wafer 50. The medium layer 62 must to be removed later, and thus a material able to be removed easily is required. In this embodiment, the medium layer 62 is selected from Benzocyclobutene (BCB), polyimide, epoxy, photoresist, and dry film that can be formed on the surface of the device layer 56 by either coating or sticking. Also, the material and forming method of the medium layer 62 is not limited to this embodiment.

Figure 7:
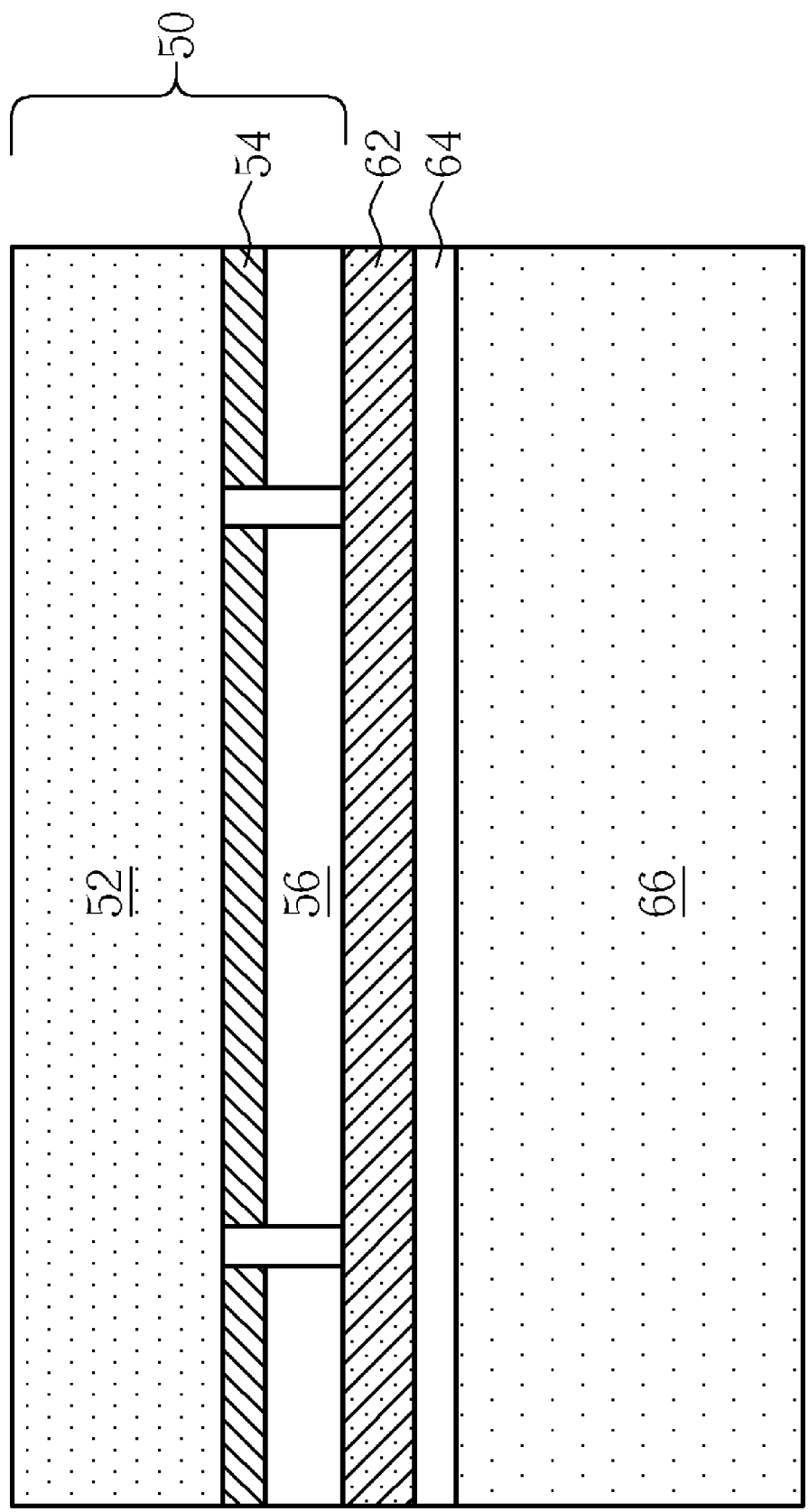

As shown in FIG. 7, the medium layer 62 is then bonded to a carrier wafer 66 with a bonding layer 64 so as to fasten the device wafer 50 on the carrier wafer 66. In this embodiment, the bonding layer 64 is a thermal release tape or UV tape, but not limited to. The thermal release tape can be removed by heating, and the UV tape can be removed by UV irradiation. The bonding layer 64 can also be other material as long as the material can be easily removed without causing damage to the device layer 56 and the medium layer 62. The carrier wafer 66 can be a semiconductor wafer, a glass wafer, a quartz wafer, etc. It is to be noted that if UV tape is adopted as the bonding layer 64, the carrier wafer 66 must be a transparent wafer such as a glass wafer or a quartz wafer. In addition, a wafer thinning process can be selectively performed to reduce the thickness of the substrate layer 52 wherever necessary.

Figure 8:
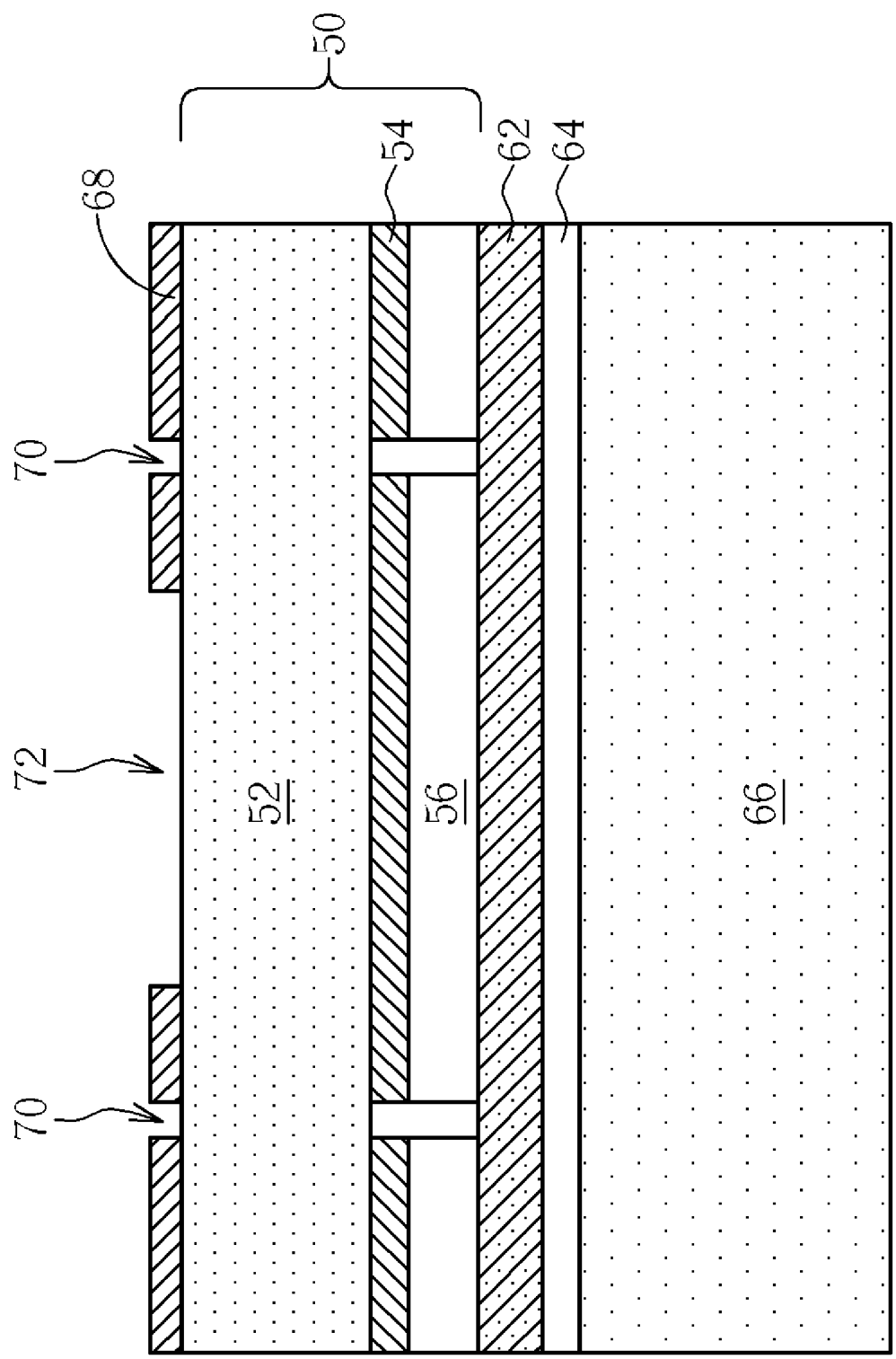

As shown in FIG. 8, a second mask pattern 68 is formed on the surface of the substrate layer 52. The second mask pattern 68 includes a plurality of second openings 70 corresponding to the first openings (not shown). The second mask pattern 68 can be a photoresist pattern or other materials normally adopted as a hard mask. In addition, the pattern layout of the second mask pattern 68 can be modified if different devices are formed in the device layer 56. For instance, if the devices to be diced are piezoresistor sensor devices, the second mask pattern 68 further includes third openings 72 so as to form stand (supporter) of the piezoresistor sensor devices.

Figure 9:
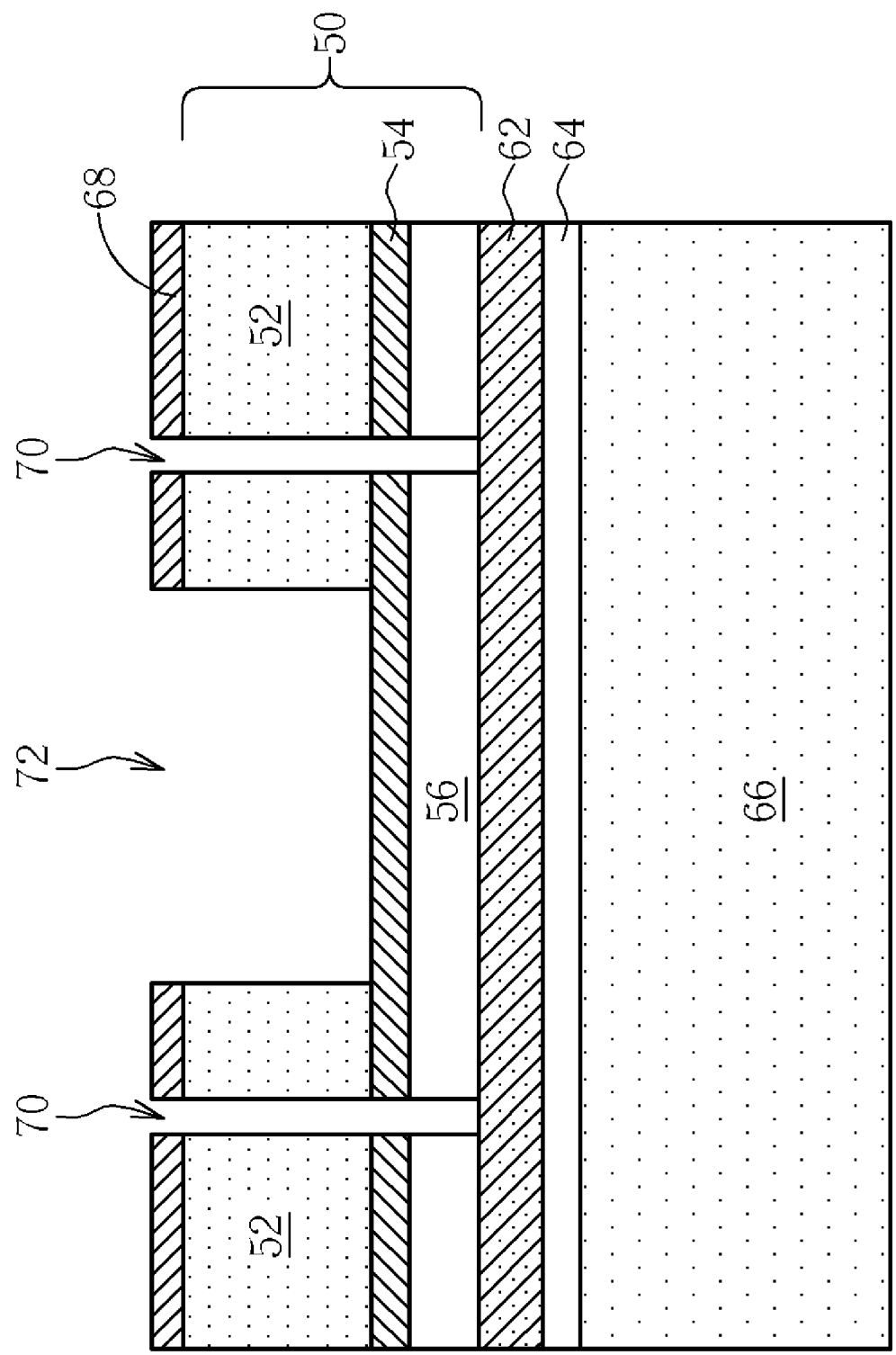
Figure 10:
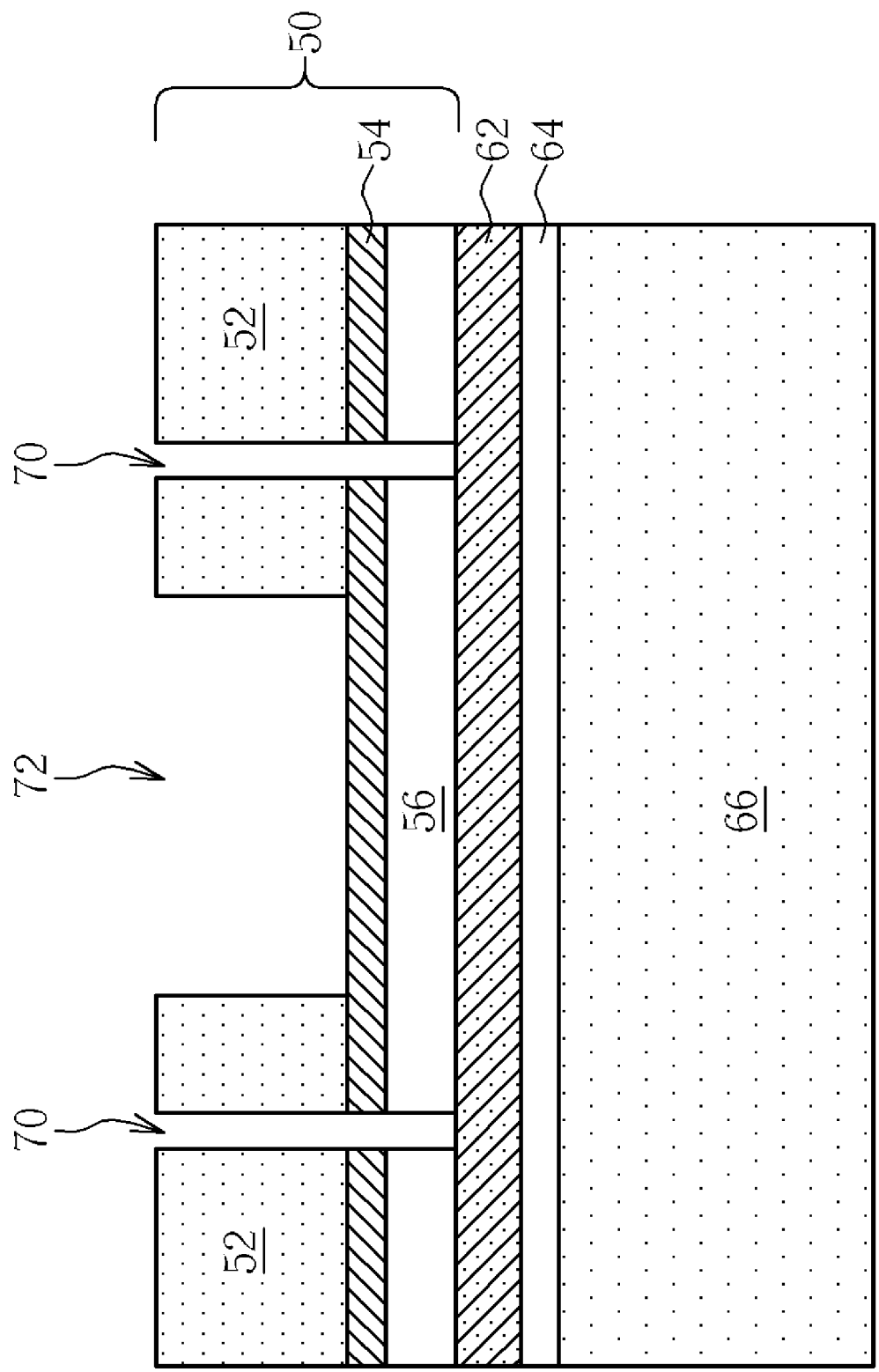

As shown in FIG. 9, an anisotropic etching process, e.g. a plasma etching process, is performed to remove the substrate layer 52 not covered by second mask pattern 68. As shown in FIG. 10, the second mask pattern 68 is then removed.

Figure 11:
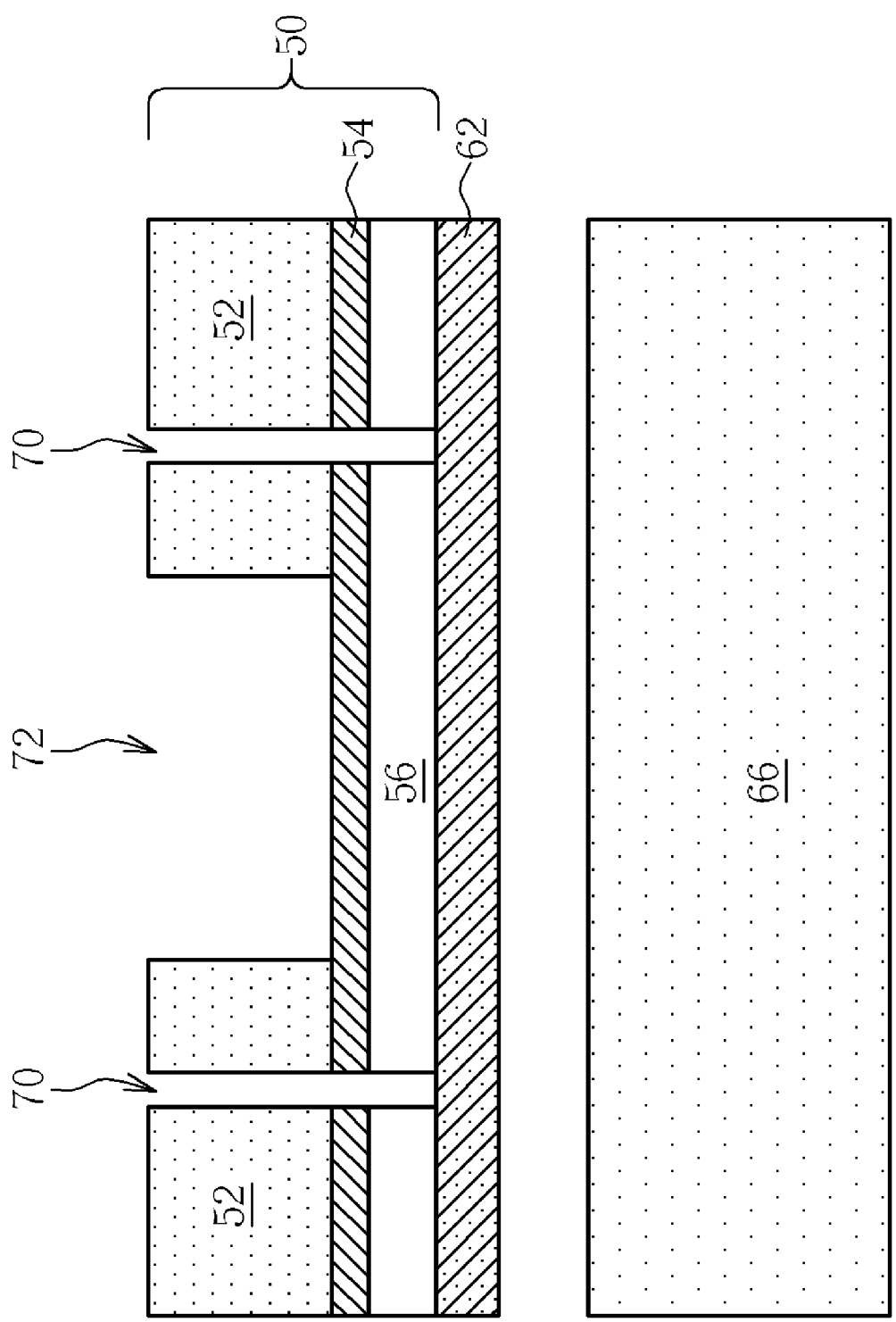

As shown in FIG. 11, the bonding layer 64 is removed so as to separate the medium layer 62 from the carrier wafer 66. If the bonding layer 64 is a thermal release tape, separation of the medium layer 62 and the carrier wafer 66 is carried out by raising the temperature to over the separation temperature of the thermal release tape. If the bonding layer 64 is a UV tape, separation of the medium layer 62 and the carrier wafer 66 is implemented by UV irradiation from bottom of the carrier wafer 66.

Figure 12:
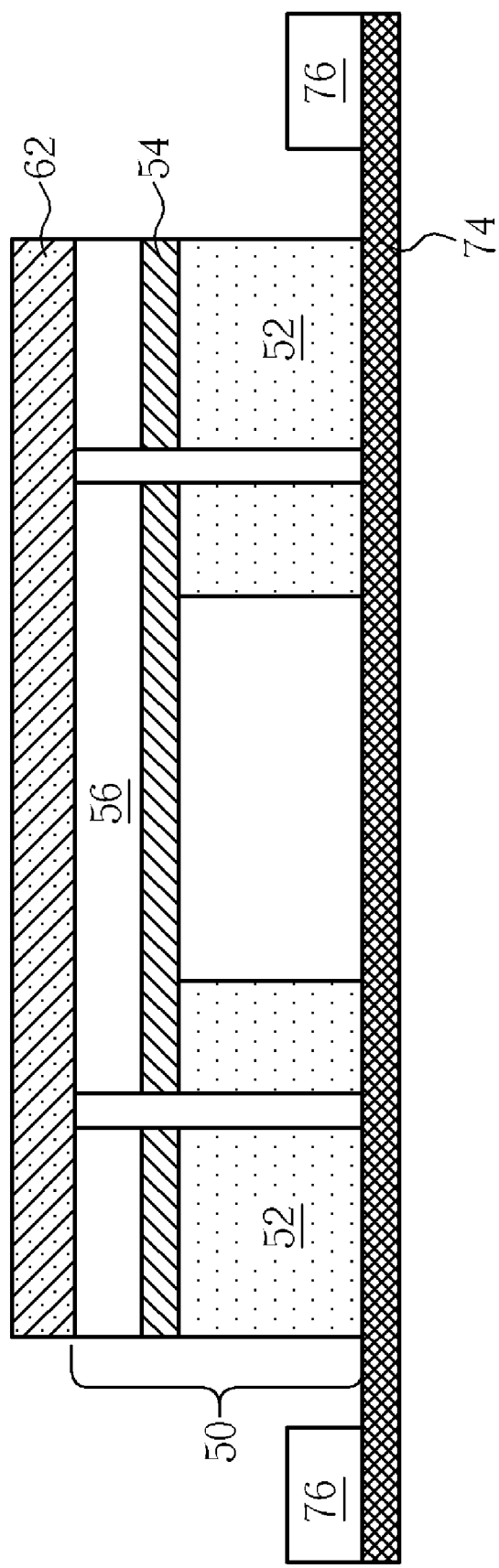
Figure 13:
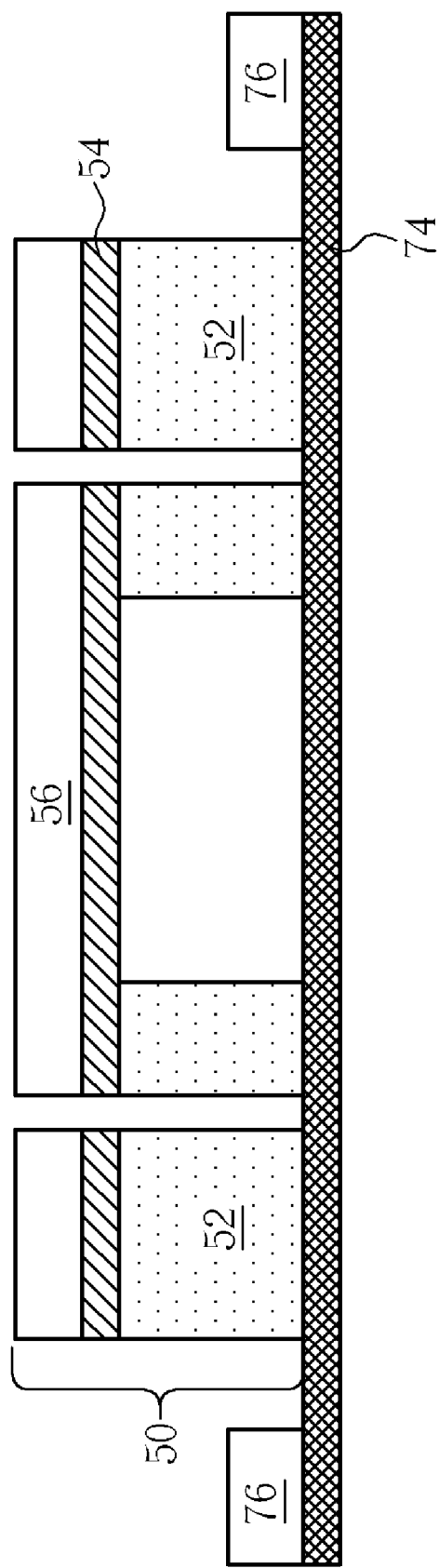

As shown in FIG. 12, the substrate layer 52 is then bonded to an extendable film 74 that is fastened on a supporting frame 76. As shown in FIG. 13, the medium layer 62 is removed from the surface of the device layer 56. The medium layer 62 can be removed in different manners. For diminishing possibility of particle problems, a dry clean process, e.g. an oxygen plasma clean process or a super-critical carbon dioxide clean process, is preferred. Accordingly, while the substrate layer 52 is bonded to the extendable film 74, automatic wafer expansion and wafer sorting process can be directly performed by extending the extendable film 74.

The method of segmenting a wafer according to the present invention utilizes a medium layer to bond the device wafer to a carrier wafer. Subsequently, an anisotropic etching process is performed from the substrate layer, and the device wafer is then bonded to an extendable film. Consequently, automatic wafer expansion and wafer sorting process can be directly performed. In addition, the medium layer is removed by a dry clean process in such a manner that the device layer is not contaminated and the extendable film is not damaged. For some MEMS devices, e.g. pressure sensor devices, IR sensor devices, and MEMS microphone devices, the suspended structure of these devices can be easily fabricated in the anisotropic etching process from the substrate layer. On the contrary, the wafer expansion process according to the conventional method has to be implemented manually. Consequently, production yield is relatively low.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of segmenting a wafer comprising:
providing a device wafer comprising a substrate layer and a device layer disposed from bottom to top;
forming a first mask pattern on a surface of the device layer, the first mask pattern comprising a plurality of first openings which partially expose the surface of the device layer;
removing the device layer not covered by the first mask pattern;
removing the first mask pattern, and forming a medium layer on the surface of the device layer;
bonding a surface of the medium layer to a carrier wafer;
forming a second mask pattern on a surface of the substrate layer, the second mask pattern comprising a plurality of second openings corresponding to the first openings;
removing the substrate layer not covered by the second mask pattern;
removing the second mask pattern;
separating the medium layer from the carrier wafer; and
bonding the substrate layer to an extendable film, and removing the medium layer.

2. The method of claim 1, wherein bonding the substrate layer to the extendable film is performed prior to removing the medium layer.

3. The method of claim 1, wherein removing the medium layer is performed prior to bonding the substrate layer to the extendable film.

4. The method of claim 1, wherein the medium layer is bonded to the carrier wafer with a bonding layer.

5. The method of claim 4, wherein the bonding layer is a thermal release tape.

6. The method of claim 4, wherein the bonding layer is a UV tape.

7. The method of claim 1, wherein removing the device layer not covered by the first mask pattern is implemented by an anisotropic etching process.

8. The method of claim 7, wherein the anisotropic etching process is a plasma etching process.

9. The method of claim 1, wherein removing the substrate layer not covered by the second mask pattern is implemented by an anisotropic etching process.

10. The method of claim 9, wherein the anisotropic etching process is a plasma etching process.

11. The method of claim 1, wherein the second mask pattern further comprises a plurality of third openings not corresponding to the first openings.

12. The method of claim 1, wherein the device wafer further comprises an insulating layer disposed between the device layer and the substrate layer.

13. The method of claim 12, further comprising removing the insulating layer not protected by the first mask pattern subsequent to removing the device layer not covered by the first mask pattern.

14. The method of claim 1, wherein the medium layer is selected from the group consisting of Benzocyclobutene (BCB), polyimide, epoxy, photoresist, and dry film.

15. The method of claim 1, wherein removing the medium layer is implemented by a dry clean process.

16. The method of claim 15, wherein the dry clean process is an oxygen plasma clean process.

17. The method of claim 15, wherein the dry clean process is a supercritical carbon dioxide clean process.

* * * * *